(12) United States Patent
Long et al.

(10) Patent No.: US 11,462,287 B2
(45) Date of Patent: Oct. 4, 2022

(54) MEMORY TEST METHOD, STORAGE MEDIUM AND COMPUTER DEVICE

(71) Applicant: CHANGXIN MEMORY TECHNOLOGIES, INC., Hefei (CN)

(72) Inventors: Guangteng Long, Hefei (CN); Hao He, Hefei (CN); Dan Lu, Hefei (CN); Bo Hu, Hefei (CN)

(73) Assignee: CHANGXIN MEMORY TECHNOLOGIES, INC., Hefei (CN)

( * ) Notice: Subject to any disclaimer, the term of this patent is extended or adjusted under 35 U.S.C. 154(b) by 0 days.

(21) Appl. No.: 17/433,333

(22) PCT Filed: Mar. 26, 2021

(86) PCT No.: PCT/CN2021/083247
§ 371 (c)(1),
(2) Date: Aug. 24, 2021

(87) PCT Pub. No.: WO2021/190630
PCT Pub. Date: Sep. 30, 2021

(65) Prior Publication Data
US 2022/0148668 A1 May 12, 2022

(30) Foreign Application Priority Data
Mar. 27, 2020 (CN) .......................... 202010230948.1

(51) Int. Cl.
*G11C 29/00* (2006.01)
*G11C 29/10* (2006.01)
(Continued)

(52) U.S. Cl.
CPC ........ *G11C 29/10* (2013.01); *G11C 29/12015* (2013.01); *G11C 29/36* (2013.01); *G11C 29/46* (2013.01); *G11C 2029/3602* (2013.01)

(58) Field of Classification Search
CPC ... G11C 29/10; G11C 29/12015; G11C 29/36; G11C 29/46; G11C 2029/3602
(Continued)

(56) References Cited

U.S. PATENT DOCUMENTS 8,208,326 B1 * 6/2012 Solt .................. G11C 29/10
365/201
9,026,725 B2 5/2015 Kostinsky et al.
(Continued)

FOREIGN PATENT DOCUMENTS

CN 104903877 A 9/2015
CN 105931670 A 9/2016
(Continued)

OTHER PUBLICATIONS

International Search Report cited in PCT/CN2021/083247 dated Jun. 30, 2021, 8 pages.
(Continued)

*Primary Examiner* — Christine T. Tu
(74) *Attorney, Agent, or Firm* — Cooper Legal Group, LLC

(57) ABSTRACT

The present disclosure provides a memory test method, a storage medium and a computer device. The memory test method comprises: obtaining a target test pattern that needs to be written into a plurality of chip interfaces, the plurality of chip interfaces being connected to a plurality of physical interfaces in a one-to-one correspondence; determining second information of the chip interfaces corresponding to first information of the physical interfaces, and using the first information and the second information as corresponding connection information; remapping the corresponding connection information to obtain mapped connection information; and determining, according to the target test pattern and
(Continued)

the mapped connection information, an initial test pattern that needs to be written into the physical interfaces.

14 Claims, 2 Drawing Sheets

(51) Int. Cl.
*G11C 29/12* (2006.01)
*G11C 29/36* (2006.01)
*G11C 29/46* (2006.01)

(58) Field of Classification Search
USPC .................................................. 714/723, 718
See application file for complete search history.

(56) References Cited

U.S. PATENT DOCUMENTS

| 10,303,543 | B1 | 5/2019 | Maclaren |
| 10,552,066 | B2 | 2/2020 | Kandikonda |
| 2013/0246734 | A1* | 9/2013 | Schaefer ............... G06F 12/063 711/E12.001 |
| 2014/0376320 | A1 | 12/2014 | Loh et al. |
| 2016/0041878 | A1* | 2/2016 | Davis .................... G06F 3/0619 714/6.13 |

FOREIGN PATENT DOCUMENTS

| CN | 106652897 A | 5/2017 |
| TW | 201913654 A | 4/2019 |

OTHER PUBLICATIONS

English translation of Written Opinion cited in PCT/CN2021/083247 dated Jun. 30, 2021, 4 pages.
English translation of International Search Report cited in PCT/CN2021/083247 dated Jun. 30, 2021, 4 pages.

* cited by examiner

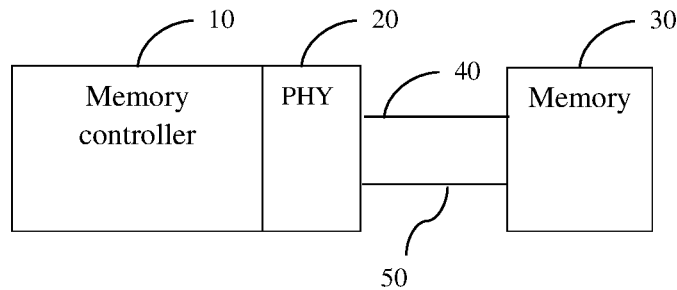

FIG. 1

Obtain a target test pattern to be written into a plurality of chip interfaces, the plurality of chip interfaces being connected to a plurality of physical interfaces in a one-to-one correspondence — S100

Determine second information of the chip interfaces corresponding to first information of the physical interfaces, and using the first information and the second information as corresponding connection information — S110

Remap the corresponding connection information to obtain mapped connection information — S120

Determine, according to the target test pattern and the mapped connection information, an initial test pattern to be written into the physical interfaces — S130

FIG. 2

MEMORY TEST METHOD, STORAGE MEDIUM AND COMPUTER DEVICE

CROSS-REFERENCE TO RELATED APPLICATIONS

The present disclosure claims the priority to Chinese Patent Application No. 202010230948.1, titled "Memory test method, storage medium and computer device", filed on Mar. 27, 2020, which is incorporated herein by reference in its entirety.

TECHNICAL FIELD

The present disclosure relates to the technical field of semiconductors, and in particular, to a memory test method, a storage medium and a computer device.

BACKGROUND

With the rapid development of integrated circuit technology, memories have attracted more and more attention.

A memory generally comprises a plurality of chip interfaces, the memory controller is connected to the memory through a plurality of physical interfaces (PHY), and the plurality of physical interfaces are connected to the plurality of chip interfaces of the memory in a one-to-one correspondence. In the process of testing the memory, it is necessary to accurately control the test pattern written into the chip interfaces by the memory controller. However, after the operator writes the required pattern into the physical interfaces, the data line between the physical interfaces and the chip interfaces swizzles due to the line length and other reasons, and it is often impossible to write the required test pattern into the chip interfaces. This increases the difficulty of testing.

It is to be noted that the information disclosed in the background section is only provided to facilitate the understanding of the background of the present disclosure, and therefore may include information that does not constitute the existing technologies known to a person of ordinary skill in the art.

SUMMARY

The purpose of the present disclosure is to provide a memory test method, a storage medium and a computer device.

According to one aspect of the present disclosure, there is provided a memory test method, comprising:

obtaining a target test pattern that needs to be written into a plurality of chip interfaces, the plurality of chip interfaces being connected to a plurality of physical interfaces in a one-to-one correspondence;

determining second information of the chip interfaces corresponding to first information of the physical interfaces, and using the first information and the second information as corresponding connection information;

remapping the corresponding connection information to obtain mapped connection information; and determining, according to the target test pattern and the mapped connection information, an initial test pattern that needs to be written into the physical interfaces.

According to one aspect of the present disclosure, there is provided a computer-readable storage medium having a computer program stored thereon that, when executed by a processor, implements steps of the method in any embodiment of the present disclosure.

According to one aspect of the present disclosure, there is provided a computer device, comprising a memory, a processor, and a computer program stored on the memory and capable of being run on the processor, wherein the processor implements steps of the method in any embodiment of the present disclosure.

It should be understood that the aforementioned general description and following detailed description are merely exemplary and explanatory, and the present disclosure is not limited thereto.

BRIEF DESCRIPTION OF THE DRAWINGS

The above and other features and advantages of the present disclosure will become more apparent by describing in detail the exemplary embodiments of the present disclosure with reference to the accompanying drawings. Apparently, the drawings to be used in the following description show only some embodiments of the present disclosure. For a person of ordinary skill in the art, other drawings may be obtained according to these drawings, without paying any creative effort.

FIG. 1 is a framework diagram of a test method in an implementation of the present disclosure;

FIG. 2 is a flowchart of the test method in an implementation of the present disclosure;

DETAILED DESCRIPTION

Figure 3:
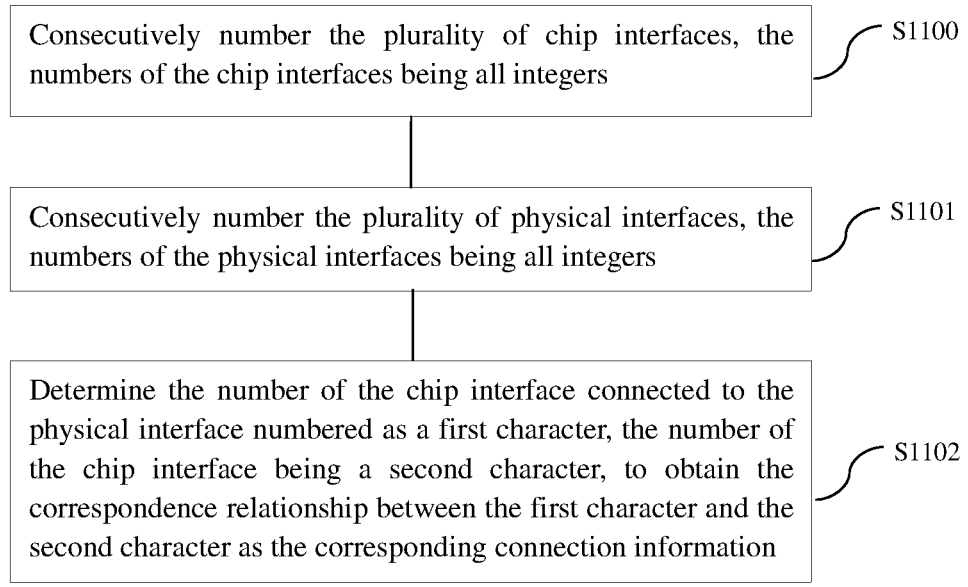
FIG. 3 is a flowchart of step S110 in the test method in an implementation of the present disclosure.

Exemplary implementations will now be described more fully with reference to the accompanying drawings. However, the exemplary implementations may be implemented in various forms, and should not be construed as being limited to the examples set forth herein; instead, these embodiments are provided to make the present disclosure comprehensive and complete, and to fully convey the concepts of the exemplary embodiments to those skilled in the art. The described features, structures or characteristics may be combined in one or more implementations in any suitable way. In the following description, many specific details are provided to give a sufficient understanding of the implementations of the present disclosure. However, it may be realized by those skilled in the art that the technical solutions of the present disclosure may be practiced without one or more of the specific details. In other cases, the well-known technical solutions will not be shown or described in detail in order to avoid obscuring aspects of the present disclosure. The same reference numerals in the figures denote the same or similar structures, and thus the repeated description thereof will be omitted.

The terms "a", "an", "the" and "said" are used to indicate the presence of one or more elements/components/etc.; the terms "comprising", "including" and "having" are used to indicate non-exclusive inclusion and indicate the presence of other elements/components/etc., in addition to the listed elements/components/etc.

The implementations of the present disclosure provide a memory test method. The memory comprises a plurality of chip interfaces. The chip interfaces may be, but not limited to, data interfaces of the memory. The chip interfaces may be address interfaces of the memory. The memory is a double data rate synchronous dynamic random access memory (DDR SDRAM), but the implementations of the present disclosure are not limited thereto. As shown in FIG. 1, the memory controller 10 is connected to the memory 30 through physical interfaces (PHYs) 20, and a plurality of physical interfaces 20 are connected to a plurality of chip interfaces of the memory 30 in a one-to-one correspondence through a command address signal line 40 and a data signal line 50. The memory controller 10 may send an address pattern to the memory 30 through the command address signal line 40. Of course, it may send a data pattern to the memory 30 through the data signal line 50.

As shown in FIG. 2, the memory test method may comprise steps S100 to S130.

S100: A target test pattern that needs to be written into a plurality of chip interfaces is obtained, the plurality of chip interfaces being connected to a plurality of physical interfaces in a one-to-one correspondence.

S110: Second information of the chip interfaces corresponding to first information of the physical interfaces is determined, and the first information and the second information are used as corresponding connection information.

S120: The corresponding connection information is remapped to obtain mapped connection information.

S130: An initial test pattern that needs to be written into the physical interfaces is determined according to the target test pattern and the mapped connection information.

By the memory test method in the implementation of the present disclosure, the initial test pattern that needs to be written into the physical interfaces is determined according to the target test pattern and the mapped connection information. Since the mapped connection information is obtained by remapping the corresponding connection information, and the corresponding connection information is obtained by determining the second information of the chip interfaces corresponding to the first information of the physical interfaces, the target test pattern required for the test can be written into the chip interfaces after the determined initial test pattern is written into the physical interfaces. Thus, the difficulty of testing is reduced.

The steps of the memory test method in the implementation of the present disclosure will be described in detail below.

In the step S100, a target test pattern that needs to be written into a plurality of chip interfaces is obtained, the plurality of chip interfaces being connected to a plurality of physical interfaces in a one-to-one correspondence.

The target test pattern may be a data pattern, that is, the chip interfaces are data interfaces of the memory. Of course, the target test pattern may be an address pattern, that is, the chip interfaces are address interfaces of a memory. In an implementation of the present disclosure, the target test pattern is a non-binary number, for example, a hexadecimal number, but the implementation of the present disclosure is not limited thereto. In other implementations of the present disclosure, the target test pattern is a binary number.

In the step S110, second information of the chip interfaces corresponding to first information of the physical interfaces is determined, and the first information and the second information are used as corresponding connection information.

In the present disclosure, the physical interfaces may be numbered in advance. For example, the physical interfaces may be numbered by letters A, B, C, D, etc. However, the present disclosure is not limited thereto. The physical interfaces may be numbered by numbers 1, 2, 3, etc. The first information of the physical interfaces may be the number information of the physical interfaces. However, it is not limited in the embodiment of the present disclosure. In the present disclosure, the chip interfaces may be numbered in advance. For example, the chip interfaces may be numbered by letters A, B, C, D, etc. However, the present disclosure is not limited thereto. The chip interfaces may be numbered by numbers 1, 2, 3, etc. The second information of the chip interfaces may be the number information of the chip interfaces. However, it is not limited in the embodiment of the present disclosure.

Taking the numbering of the chip interfaces and the physical interfaces by numbers as an example, as shown in FIG. 3, the step S110 may comprise steps S1100 to S1102.

In the step S1100, the plurality of chip interfaces are consecutively numbered, the numbers of the chip interfaces being all integers.

The step S1100 may comprise: consecutively numbering the plurality of chip interfaces starting from a. Wherein, a may be a negative integer. Of course, it may be 0. However, the present disclosure is not limited thereto. It may be a positive integer. Consecutively numbering the plurality of chip interfaces starting from a is numbering the plurality of chip interfaces according to an arithmetic sequence (a, a+1, a+2, a+3, a+4, a+5, a+6 . . . a+x, where x is greater than or equal to 1). Taking, as an example, the case in which there are 16 chip interfaces and a is equal to 0, consecutively numbering the plurality of chip interfaces starting from 0 is numbering the plurality of chip interfaces according to an arithmetic sequence (0, 1, 2, 3, 4, 5, 6 . . . 13, 14, 15), wherein the initial number of the chip interface is 0 and the final number of the chip interface is 15.

In the step S1101, the plurality of physical interfaces are consecutively numbered, the numbers of the physical interfaces being all integers.

The step S1101 may comprise: consecutively numbering the plurality of physical interfaces starting from a. In the present disclosure, the plurality of physical interfaces are numbered according to an arithmetic sequence (a, a+1, a+2, a+3, a+4, a+5, a+6 . . . a+x, where x is greater than or equal to 1). Taking, as an example, the case in which there are 16 physical interfaces and a is equal to 0, consecutively numbering the plurality of physical interfaces starting from 0 is numbering the plurality of physical interfaces according to an arithmetic sequence (0, 1, 2, 3, 4, 5, 6 . . . 13, 14, 15), wherein the initial number of the physical interface is 0 and the final number of the physical interface is 15. In addition, the initial number of the chip interface and the initial number of the physical interface may be equal. Of course, they may not be equal.

In the step S1102, the number of the chip interface connected to the physical interface numbered as a first character is determined, the number of the chip interface being a second character, to obtain the correspondence relationship between the first character and the second character as the corresponding connection information.

The step S1102 may comprise: writing a first reference pattern into the plurality of physical interfaces, the first reference pattern being directed to the physical interface numbered as the first character; obtaining a second reference pattern output from the plurality of chip interfaces, the second reference pattern being obtained by transmitting the first reference pattern; and determining the number of the chip interface to which the second reference pattern is directed, the number of the chip interface being the second character.

Taking, as an example, the case in which the plurality of chip interfaces are numbered according to the arithmetic sequence (0, 1, 2, 3, 4, 5, 6 . . . 13, 14, 15) and the plurality of physical interfaces are numbered according to the arithmetic sequence (0, 1, 2, 3, 4, 5, 6 . . . 13, 14, 15), for a memory, a first reference pattern (1000 0000 0000 0000) is written into the plurality of physical interfaces, wherein "1" in the first reference pattern corresponds to the physical interface numbered as 0; and a second reference pattern corresponding to the chip interface is obtained, wherein the chip interface corresponding to the "1" in the second reference pattern is correspondingly connected to the physical interface numbered as 0. In this way, the number of the chip interface to which the second reference pattern is directed may be determined, and the number of the chip interface is recorded as a second character. For example, if the physical interface numbered as 0 is correspondingly connected to the chip interface numbered as 4, the second reference pattern obtained at the chip interface is displayed as "1" output by the chip interface numbered as 4, that is, the second character is 4. In the similar way, the corresponding connection for the other numbers may be determined by the same method. The corresponding connection information determined in the final step S1102 is shown in Table 1.

TABLE 1

| First character | 15 | 14 | 13 | 12 | 11 | 10 | 9 | 8 | 7 | 6 | 5 | 4 | 3 | 2 | 1 | 0 |
|---|---|---|---|---|---|---|---|---|---|---|---|---|---|---|---|---|
| Second character | 13 | 14 | 9 | 11 | 8 | 10 | 12 | 15 | 0 | 7 | 3 | 2 | 1 | 6 | 5 | 4 |

In the step S120, the corresponding connection information is remapped to obtain mapped connection information.

Figure 4:
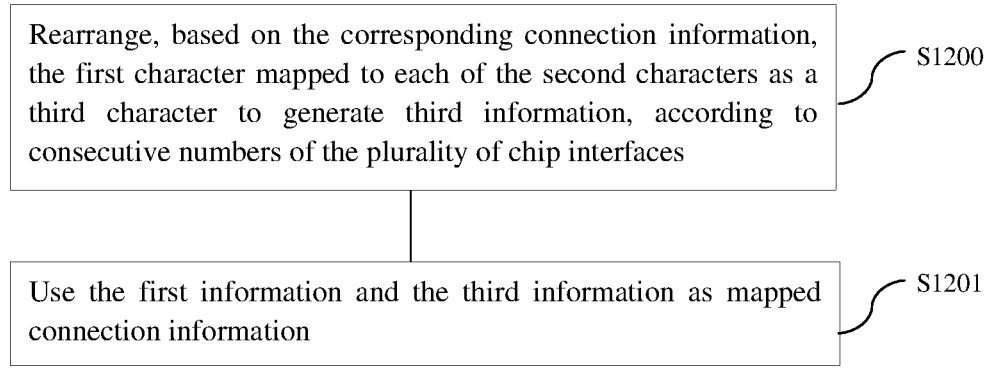
FIG. 4 is a flowchart of step S120 in the test method in an implementation of the present disclosure.

For example, as shown in FIG. 4, the step 120 may comprise steps S1200 and S1201.

S1200: The first character mapped to each of the second characters is rearranged as a third character, based on the corresponding connection information and according to consecutive numbers of the plurality of chip interfaces, to generate third information.

Taking, as an example, the case in which the corresponding connection information is what shown in Table 1, it may be known from Table 1 that the second character 0 corresponds to the first character 7, the second character 1 corresponds to the first character 3, the second character 2 corresponds to the first character 4, . . . , the second character 15 corresponds to the first character 8. After arranging the second characters in ascending or descending order, the third information formed by the third characters, which is determined in the step S1200, is shown in Table 2.

TABLE 2

| Second character | 15 | 14 | 13 | 12 | 11 | 10 | 9 | 8 | 7 | 6 | 5 | 4 | 3 | 2 | 1 | 0 |
|---|---|---|---|---|---|---|---|---|---|---|---|---|---|---|---|---|
| Third character | 8 | 14 | 15 | 9 | 12 | 10 | 13 | 11 | 6 | 2 | 1 | 0 | 5 | 4 | 3 | 7 |

S1201: The first information and the third information are used as mapped connection information.

Taking, as an example, the case in which the corresponding connection information is what shown in Table 1 and the third information is what shown in Table 2, the mapped connection information determined in the step S1201 is shown in Table 3.

TABLE 3

| First character | 15 | 14 | 13 | 12 | 11 | 10 | 9 | 8 | 7 | 6 | 5 | 4 | 3 | 2 | 1 | 0 |
|---|---|---|---|---|---|---|---|---|---|---|---|---|---|---|---|---|
| Third character | 8 | 14 | 15 | 9 | 12 | 10 | 13 | 11 | 6 | 2 | 1 | 0 | 5 | 4 | 3 | 7 |

In the step S130, an initial test pattern that needs to be written into the physical interfaces is determined according to the target test pattern and the mapped connection information.

The initial test pattern may be a data pattern. Of course, the initial test pattern may be an address pattern. In an implementation of the present disclosure, the initial test pattern is a non-binary number, for example, a hexadecimal number, but the implementation of the present disclosure is not limited thereto. Taking the target test pattern and the initial test pattern being both non-binary numbers as an example, the step S130 may comprise: representing the target test pattern in binary; and determining, according to the target test pattern represented in binary and the mapped connection information, an initial test pattern represented in binary that needs to be written into the physical interfaces. Of course, after determining, according to the target test pattern represented in binary and the mapped connection information, an initial test pattern represented in binary that needs to be written into the physical interfaces, the step 130 may further comprise: converting the initial test pattern represented in binary into the initial test pattern represented in hexadecimal.

In an implementation of the present disclosure, taking the initial number of the chip interface being equal to the initial number of the physical interface as an example, determining, according to the target test pattern represented in binary and the mapped connection information, an initial test pattern represented in binary that needs to be written into the physical interfaces may comprise: left-shifting a target number in the target test pattern corresponding to the physical interface numbered as a first character to obtain intermediate numbers, wherein the left-shifted number of digits is equal to a value obtained by subtracting the initial number from the third character corresponding to the first character in the mapped connection information; and adding the intermediate numbers to obtain an initial test pattern that needs to be written into the physical interfaces. Taking, as an example, the case in which n represents the first character, m represents the third character, and the initial number is a, the left-shifted number of digits is equal to (m-a).

Further, taking, as an example, the case in which the target test pattern is (1010 1010 1010 1010) and the mapped connection information is what shown in Table 3, the step S130 is specifically as follows:

The target number 1 in the target test pattern corresponding to the physical interface numbered as 1 is shifted to the left by 3 digits, and the obtained intermediate number is 1000; the target number 1 in the target test pattern corresponding to the physical interface numbered as 3 is shifted to the left by 5 digits, and the obtained intermediate number is 10 0000; the target number 1 in the target test pattern corresponding to the physical interface numbered as 5 is shifted to the left by 1 digit, and the obtained intermediate number is 10; the target number 1 in the target test pattern corresponding to the physical interface numbered as 7 is shifted to the left by 6 digits, and the obtained intermediate number is 100 0000; the target number 1 in the target test pattern corresponding to the physical interface numbered as 9 is shifted to the left by 13 digits, and the obtained intermediate number is 10 0000 0000 0000; the target number 1 in the target test pattern corresponding to the physical interface numbered as 11 is shifted to the left by 12 digits, and the obtained intermediate number is 1 0000 0000 0000; the target number 1 in the target test pattern corresponding to the physical interface numbered as 13 is shifted to the left by 15 digits, and the obtained intermediate number is 1000 0000 0000 0000; the target number 1 in the target test pattern corresponding to the physical interface numbered as 15 is shifted to the left by 18 digits, and the obtained intermediate number is 1 0000 0000. Since the target number in the target test pattern corresponding to the even-numbered physical interfaces is 0, the target number in the target test pattern corresponding to the even-numbered physical interfaces is shifted to the left, and the obtained intermediate numbers are all 0. The obtained intermediate numbers obtained above are all binary numbers, and all the intermediate numbers are added together to obtain the initial test pattern which is (1011 0001 0110 1010). After the determined initial test pattern (1011 0001 0110 1010) is written into the physical interfaces, the target test pattern (1010 1010 1010 1010) required for the test may be written into the chip interfaces. This reduces the difficulty of testing.

An implementation of the present disclosure further provides a computer-readable storage medium having a computer program stored thereon that, when executed by a processor, implements steps of the memory test method described in any of the above embodiments. The readable storage medium may include hard disks, random access memory (RAM), read-only memory (ROM), erasable programmable read-only memory (EPROM or flash memory), optical fiber, portable compact disk read-only memory (CD-ROM), optical storage devices, magnetic storage devices, or any suitable combination of the above. Since the program on the readable storage medium can, when being executed, implement the steps of the memory test method described in any of the above implementations, it has the same beneficial effects as the above implementations. The specific beneficial effects will not be repeated here.

According to one aspect of the present disclosure, there is provided a computer device, comprising a memory, a processor, and a computer program stored in the memory and capable of being run on the processor. Since the program can, when being executed by the processor, implement the steps of the memory test method described in any of the above implementations, it has the same beneficial effects as the above implementations. The specific beneficial effects will not be repeated here.

Those skilled in the art will readily think of other implementations of the present disclosure by considering the specification and practicing the invention disclosed herein. The present application is intended to encompass any variations, uses, or adaptive changes of the present disclosure. These variations, uses, or adaptive changes follow the general principles of the present disclosure and include common knowledge or conventional technical means in the technical field. The specification and the embodiments are just exemplary, and the true scope and spirit of the present disclosure are defined by the appended claims.

The invention claimed is:

1. A memory test method, comprising:
   obtaining a target test pattern that needs to be written into a plurality of chip interfaces of a memory, the plurality of chip interfaces being connected to a plurality of physical interfaces in a one-to-one correspondence;
   determining second information of the chip interfaces corresponding to first information of the physical interfaces, and using the first information and the second information as corresponding connection information;
   remapping the corresponding connection information to obtain mapped connection information;
   determining, according to the target test pattern and the mapped connection information, an initial test pattern that needs to be written into the physical interfaces; and writing the initial test pattern into the physical interfaces for writing the target test pattern into the chip interfaces;

wherein the method is performed by a processor.

2. The memory test method according to claim 1, wherein the determining second information of the chip interfaces corresponding to first information of the physical interfaces comprises:

consecutively numbering the plurality of chip interfaces, the numbers of the chip interfaces being all integers;

consecutively numbering the plurality of physical interfaces, the numbers of the physical interfaces being all integers; and determining the number of the chip interface connected to the physical interface numbered as a first character, the number of the chip interface being a second character, to obtain a correspondence relationship between the first character and the second character as the corresponding connection information.

3. The memory test method according to claim 2, wherein the determining the number of the chip interface connected to the physical interface numbered as a first character, the number of the chip interface being a second character, comprises:

writing a first reference pattern into the plurality of physical interfaces, the first reference pattern being directed to the physical interface numbered as the first character;

obtaining a second reference pattern output from the plurality of chip interfaces, the second reference pattern being obtained by transmitting the first reference pattern; and determining the number of the chip interface to which the second reference pattern is directed, the number of the chip interface being the second character.

4. The memory test method according to claim 2, wherein the remapping the corresponding connection information to obtain mapped connection information comprises:

rearranging, based on the corresponding connection information, the first character mapped to each of the second characters as a third character to generate third information, according to consecutive numbers of the plurality of chip interfaces; and using the first information and the third information as mapped connection information.

5. The memory test method according to claim 4, wherein the initial numbers of the chip interfaces are equal to initial numbers of the physical interfaces, and the determining, according to the target test pattern and the mapped connection information, an initial test pattern that needs to be written into the physical interfaces comprises:

representing the target test pattern in binary, and left-shifting a target number in the target test pattern corresponding to the physical interface numbered as the first character to obtain intermediate numbers, wherein the left-shifted number of digits is equal to a value obtained by subtracting the initial number from the third character corresponding to the first character in the mapped connection information; and adding the intermediate numbers to obtain the initial test pattern that needs to be written into the physical interfaces.

6. The memory test method according to claim 2, wherein the consecutively numbering the plurality of chip interfaces comprises:

consecutively numbering the plurality of chip interfaces starting from 0; and the consecutively numbering the plurality of physical interfaces comprises:

consecutively numbering the plurality of physical interfaces starting from 0.

7. The memory test method according to claim 1, wherein the target test pattern and the initial test pattern are both non-binary numbers, and the determining, according to the target test pattern and the mapped connection information, an initial test pattern that needs to be written into the physical interfaces comprises:

representing the target test pattern in binary; and determining, according to the target test pattern represented in binary and the mapped connection information, an initial test pattern represented in binary that needs to be written into the physical interfaces.

8. The memory test method according to claim 7, wherein the target test pattern and the initial test pattern are both hexadecimal numbers.

9. The memory test method according to claim 8, after the determining, according to the target test pattern represented in binary and the mapped connection information, an initial test pattern represented in binary that needs to be written into the physical interfaces, further comprising:

converting the initial test pattern represented in binary into the initial test pattern represented in hexadecimal.

10. The memory test method according to claim 1, wherein the memory used with the memory test method is a double data rate synchronous dynamic random access memory.

11. The memory test method according to claim 1, wherein the target test pattern and the initial test pattern are both data patterns.

12. The memory test method according to claim 1, wherein the target test pattern and the initial test pattern are both address patterns.

13. A non-transitory computer-readable storage medium having a computer program stored thereon that, when executed by the processor, implements steps of the method according to claim 1.

14. A computer device, comprising a second memory, the processor, and a computer program stored on the memory and capable of being run on the processor, wherein the processor implements steps of the method according to claim 1.

* * * * *